United States Patent
Fujiwara et al.

(10) Patent No.: US 10,715,075 B2
(45) Date of Patent: Jul. 14, 2020

(54) MOTOR CONTROL DEVICE AND MOTOR CONTROL METHOD

(71) Applicant: Panasonic Intellectual Property Management Co., Ltd., Osaka (JP)

(72) Inventors: Hiroshi Fujiwara, Osaka (JP); Toru Tazawa, Osaka (JP); Fumitake Saegusa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/328,706

(22) PCT Filed: Jul. 28, 2017

(86) PCT No.: PCT/JP2017/027421
§ 371 (c)(1),
(2) Date: Feb. 26, 2019

(87) PCT Pub. No.: WO2018/061452
PCT Pub. Date: Apr. 5, 2018

(65) Prior Publication Data
US 2019/0207549 A1 Jul. 4, 2019

(30) Foreign Application Priority Data
Sep. 29, 2016 (JP) .................. 2016-192322

(51) Int. Cl.
*H02P 29/50* (2016.01)
*H02P 4/00* (2006.01)
(Continued)

(52) U.S. Cl.
CPC ............. *H02P 29/50* (2016.02); *H02P 6/10* (2013.01); *H02P 23/04* (2013.01); *H02P 29/00* (2013.01);
(Continued)

(58) Field of Classification Search
None
See application file for complete search history.

(56) References Cited

U.S. PATENT DOCUMENTS 4,494,050 A * 1/1985 Godfrey .................. H02P 7/347
318/140
5,610,483 A * 3/1997 Obara ..................... B60L 15/20
318/139

(Continued)

FOREIGN PATENT DOCUMENTS

JP 2004-274976 9/2004
JP 2009-296746 12/2009
(Continued)

OTHER PUBLICATIONS

The Extended European Search Report dated Jul. 8, 2019 for the related European Patent Application No. 17855410.1.
(Continued)

*Primary Examiner* — Bentsu Ro
(74) *Attorney, Agent, or Firm* — McDermott Will & Emery LLP (57) ABSTRACT

A motor control device is configured to feedback-control state quantity of a motor or a mechanical load, and the device includes a first notch filter disposed inside a feedback control system and configured to change a frequency component to be removed, a first notch controller configured to change a first notch frequency as a center frequency of the first notch filter, a change rate calculator configured to successively calculate a notch frequency change rate indicating a change amount per unit time of the first notch frequency, and a change rate monitor configured to output a signal indicating that the notch frequency change rate has a value outside a first predetermined range when the notch frequency change rate has the value outside the first predetermined range.

6 Claims, 8 Drawing Sheets

(51) Int. Cl.
*H02P 23/04* (2006.01)
*H02P 29/032* (2016.01)
*H02P 29/00* (2016.01)
*H02P 6/10* (2006.01)
*H03H 7/12* (2006.01)

(52) U.S. Cl.
CPC ............ *H02P 29/032* (2016.02); *H03H 7/12* (2013.01); *H02P 2205/07* (2013.01)

(56) References Cited

U.S. PATENT DOCUMENTS

| 7,068,923 | B2* | 6/2006 | Miyazaki | H02P 29/045 388/806 |
| 2005/0238335 | A1* | 10/2005 | Miyazaki | H02P 29/045 388/806 |
| 2007/0222407 | A1* | 9/2007 | Sakamoto | B60W 30/20 318/611 |
| 2009/0251093 | A1* | 10/2009 | Miyazaki | G05B 19/416 318/611 |
| 2011/0221378 | A1 | 9/2011 | Tazawa et al. | |
| 2013/0113409 | A1 | 5/2013 | Tazawa et al. | |
| 2016/0016310 | A1* | 1/2016 | Zhao | G05B 7/00 700/261 |
| 2019/0199267 | A1* | 6/2019 | Fujiwara | H02P 23/12 |

FOREIGN PATENT DOCUMENTS

| JP | 2012-023834 | 2/2012 |
| JP | 2013-089089 | 5/2013 |

OTHER PUBLICATIONS

Mohsen Mojiri et al: "Estimation of Power System Frequency Using an Adaptive Notch Filter", IEEE Transactions on Instrumentation and Measurement, IEEE Service Center, Piscataway, NJ, US, vol. 56, No. 6, Dec. 1, 2007 (Dec. 1, 2007), pp. 2470-2477, XP011197797.

International Search Report of PCT application No. PCT/JP2017/027421 dated Oct. 10, 2017.

* cited by examiner

MOTOR CONTROL DEVICE AND MOTOR CONTROL METHOD

TECHNICAL FIELD

The present invention relates to a motor control device configured to control drive operation related to speed, a position, and the like of a motor or a mechanical load driven by the motor. The present invention specifically relates to a motor control device having a function of suppressing mechanical resonant vibration caused upon drive and the like.

BACKGROUND ART

There has conventionally been known a motor control device configured to suppress mechanical resonant vibration even with change in mechanical resonant frequency (see PTL 1 and the like).

A system including the conventional motor control device may have abnormal operation while a user of the system fails to recognize a sign of abnormal operation occurrence due to change in mechanical resonant frequency.

CITATION LIST

Patent Literature

PTL 1: Unexamined Japanese Patent Publication No. 2004-274976

SUMMARY OF THE INVENTION

The present invention has been achieved in view of such a problem, and it is an object of the present invention to provide a motor control device and a motor control method that enable a user to recognize more reliably than a conventional case, a sign of abnormal operation occurrence due to change in mechanical resonant frequency in a system including the motor control device.

A motor control device according to an aspect of the present invention is configured to feedback-control state quantity of a motor, and the device includes: a first notch filter disposed inside a feedback control system and configured to change a frequency component to be removed; a first notch controller configured to change a first notch frequency as a center frequency of the first notch filter; a change rate calculator configured to successively calculate a notch frequency change rate indicating a change amount per unit time of the first notch frequency; and a change rate monitor configured to output a signal indicating that the notch frequency change rate has a value outside a first predetermined range when the notch frequency change rate has the value outside the first predetermined range.

A motor control method according to another aspect of the present invention relates to feedback-controlling state quantity of a motor, and the method includes: a notch control step of changing a notch frequency as a center frequency of a notch filter configured to change a frequency component to be removed; a change rate calculation step of successively calculating a notch frequency change rate indicating a change amount per unit time of the notch frequency; and a change rate monitoring step of outputting a signal indicating that the notch frequency change rate has a value outside a predetermined range when the notch frequency change rate has the value outside the predetermined range.

The motor control device according to the present invention enables a user to recognize more reliably than a conventional case, a sign of abnormal operation occurrence due to change in mechanical resonant frequency in a system including the motor control device.

DESCRIPTION OF EMBODIMENTS (Circumstances for Achievement of an Aspect of the Present Invention)

Figure 8:
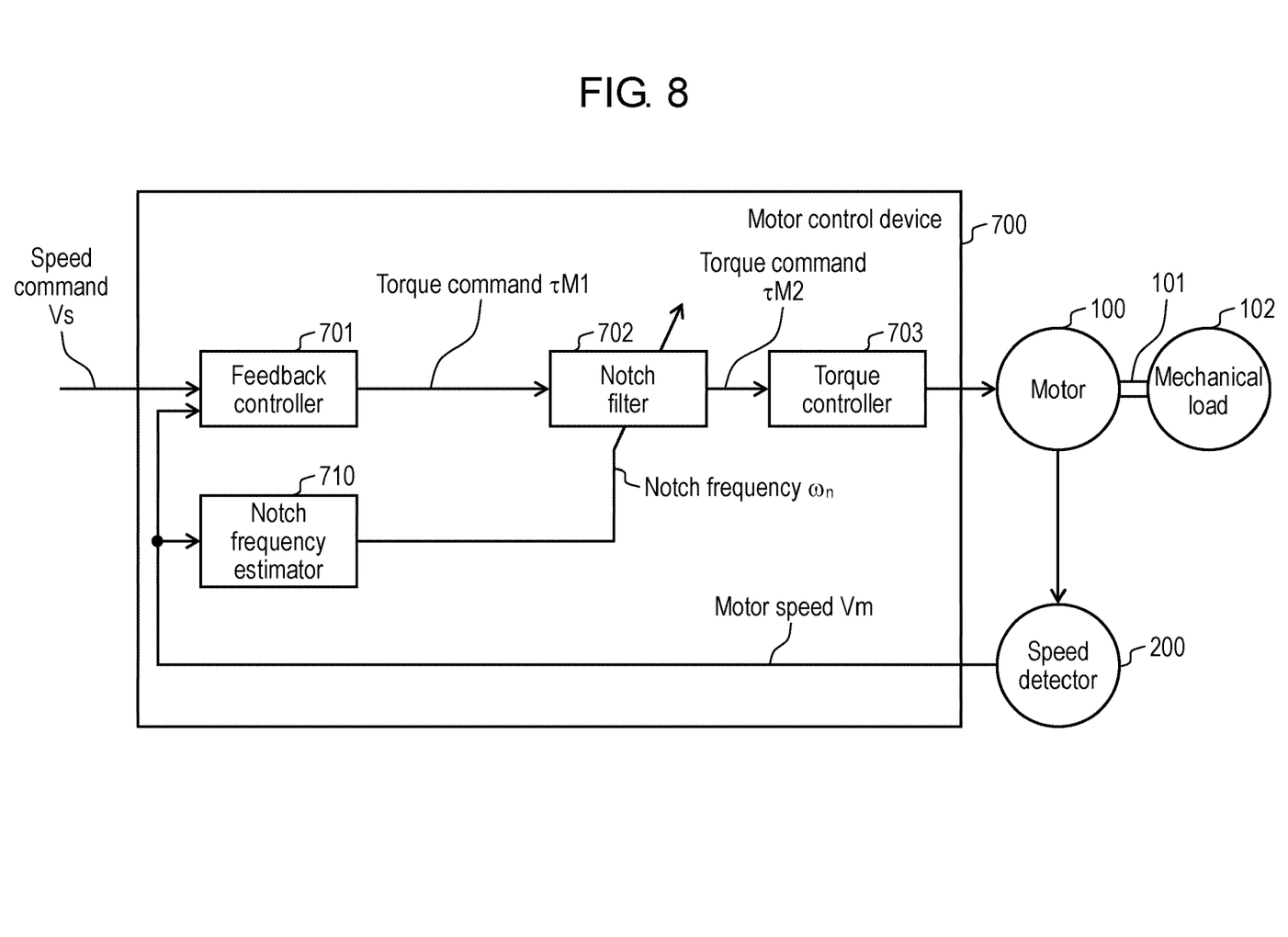
FIG. 8 is a block diagram depicting an exemplary configuration of a conventional motor control device disclosed in PTL 1.

PTL 1 and the like conventionally propose a motor control device. FIG. 8 is a block diagram depicting an exemplary configuration of a conventional motor control device disclosed in PTL 1.

FIG. 8 depicts conventional motor control device 700 connected to motor 100 and speed detector 200. Motor control device 700 receives speed command Vs indicating desired operation of a mechanical load or the motor to be driven. Motor 100 is coupled with mechanical load 102 to be driven via joint 101. Speed detector 200 detects rotational speed of motor 100 and outputs motor speed Vm to motor control device 700.

Motor control device 700 includes feedback controller 701, notch filter 702, torque controller 703, and notch frequency estimator 710. Feedback controller 701 outputs torque command τM1 to zeroize difference between speed command Vs and motor speed Vm. Notch filter 702 is configured to change a notch frequency as a center frequency. Notch filter 702 outputs new torque command τM2 obtained by removing a frequency component of the notch frequency from torque command τM1. Torque controller 703 controls motor 100 to match torque generated by the motor with torque command τM2. Motor control device 700 configures an internal feedback control system to match speed command Vs with motor speed Vm in this manner.

Notch frequency estimator 710 receives motor speed Vm. In a case where motor 100 and mechanical load 102 have mechanical resonance, motor speed Vm includes a mechanical resonant vibrational component when mechanical resonant vibration occurs. Notch frequency estimator 710 estimates a frequency of vibration included in motor speed Vm, and changes the notch frequency of notch filter 702 to the estimated frequency of the vibration.

The conventional motor control device thus configured successively changes the notch frequency of notch filter 702 to reduce amplitude of mechanical resonant vibration caused somehow. This configuration constantly suppresses mechanical resonant vibration even upon change in mechanical resonant frequency due to deterioration of a mechanism member along with long operation or the like of mechanical equipment.

The inventors have found that the conventional motor control device has the following problems.

A notch filter is configured to effectively achieve phase delay in a frequency band not exceeding a notch frequency. The notch filter itself destabilizes a feedback control system to cause oscillation when the notch frequency overlaps with a control band of the feedback control system. The control band of the feedback control system thus needs to be lower than the notch frequency. The conventional configuration takes into consideration only matching the notch frequency with a mechanical resonant frequency. When the mechanical resonant frequency is reduced to overlap with the feedback control band along with long operation or the like of mechanical equipment, the notch frequency is also reduced to overlap with the control band of the feedback control system to cause abnormal operation occurrence due to oscillation. When the mechanical resonant frequency is reduced or increased along with long operation or the like of mechanical equipment and causes change in characteristic of the mechanical equipment, a motor or a load has different drive operation in response to an identical speed command to cause abnormal operation. Abnormal operation occurrence leads to replacement of a deteriorating mechanism member for restoration of the mechanical equipment. Such replacement taking place not upon regular maintenance of the equipment needs time for preparation of the member to be replaced, replacement work, or the like and thus needs long time for restart of the equipment. The mechanical equipment is accordingly desired to prevent abnormal operation or detect a sign before abnormal operation occurrence.

In order to achieve such an object, a motor control device according to an aspect of the present invention is configured to feedback-control state quantity of a motor, and the device includes: a first notch filter disposed inside a feedback control system and configured to change a frequency component to be removed; a first notch controller configured to change a first notch frequency as a center frequency of the first notch filter; a change rate calculator configured to successively calculate a notch frequency change rate indicating a change amount per unit time of the first notch frequency; and a change rate monitor configured to output a signal indicating that the notch frequency change rate has a value outside a first predetermined range when the notch frequency change rate has the value outside the first predetermined range.

A system including this motor control device sets the notch frequency change rate outside the first predetermined range to have a value highly possibly causing abnormal operation occurrence by the motor. This motor control device thus enables a user to recognize that the system including this motor control device highly possibly causes abnormal operation occurrence due to change in mechanical resonant frequency upon output of the signal indicating the notch frequency change rate having a value outside the first predetermined range.

The system including the motor control device thus enables the user to recognize more reliably than a conventional case, a sign of abnormal operation occurrence due to change in mechanical resonant frequency.

When the notch frequency change rate has a value outside a second predetermined range narrower than the first predetermined range, the change rate calculator may calculate the notch frequency change rate at a shorter time interval for successive calculation of the notch frequency change rate in comparison to a case where the notch frequency change rate has a value within the second predetermined range.

The notch frequency change rate can thus be calculated at a shorter time interval as the notch frequency change rate exceeds the second predetermined range and approaches a value outside the first predetermined range.

The first notch controller may change the first notch frequency only within a preset notch frequency range, for example.

This configuration prevents the notch frequency from falling into an unpreferred frequency band.

The first notch frequency may be set not to overlap with a control band of the feedback control system, for example.

This configuration prevents oscillation caused by unstability of the feedback control system.

The motor control device may further include: a second notch filter disposed inside the feedback control system and configured to change a frequency component to be removed; and a second notch controller configured to change a second notch frequency as a center frequency of the second notch filter, for example. the first notch filter and the second notch filter may be connected in series, the change rate calculator may calculate a notch frequency change rate for each of the first notch controller and the second notch controller, and when at least one of the notch frequency change rates calculated by the change rate calculator has a value outside the first predetermined range, the change rate monitor may output a signal indicating that the at least one of the notch frequency change rates has the value outside the first predetermined range.

This motor control device thus enables the user to recognize a sign of abnormal operation occurrence due to change in mechanical resonant frequency in the system including the motor control device even in the case where there is multiple mechanical resonance.

A motor control method according to another aspect of the present invention relates to feedback-controlling state quantity of a motor, and the method includes: a notch control step of changing a notch frequency as a center frequency of a notch filter configured to change a frequency component to be removed; a change rate calculation step of successively calculating a notch frequency change rate indicating a change amount per unit time of the notch frequency; and a change rate monitoring step of outputting a signal indicating that the notch frequency change rate has a value outside a predetermined range when the notch frequency change rate has the value outside the predetermined range.

A system adopting this motor control method sets the notch frequency change rate outside the predetermined range to have a value highly possibly causing abnormal operation occurrence by the motor. This motor control method thus enables a user to recognize that the system adopting this motor control method highly possibly causes abnormal operation occurrence by the motor upon output of the signal indicating the notch frequency change rate having a value outside the predetermined range.

This motor control method thus enables the user to recognize more reliably than a conventional case, a sign of abnormal operation occurrence due to change in mechanical resonant frequency in the system adopting this motor control method.

These comprehensive or specific aspects can be achieved by a system, a method, an integrated circuit, a computer program, or a recording medium such as a computer-readable compact disc read-only memory (CD-ROM). The aspects may alternatively be achieved by any appropriate combination among the system, the method, the integrated circuit, the computer program, and the recording medium.

Exemplary embodiments of the present invention will now be described in detail below with reference to the drawings. The following exemplary embodiments each provide a preferred specific example of the present invention. The following exemplary embodiments exemplify numerical values, shapes, materials, constituent elements, positioning and connection modes of the constituent elements, steps, order of the steps, and the like, providing no limitation to the present invention. The present invention is to be limited only by the claims The constituent elements according to the following exemplary embodiments include constituent elements that are not recited in independent claims providing superordinate concepts of the present invention and will be described as being not essential for achievement of the object of the present invention but achieving a more preferred mode.

First Exemplary Embodiment

Figure 1:
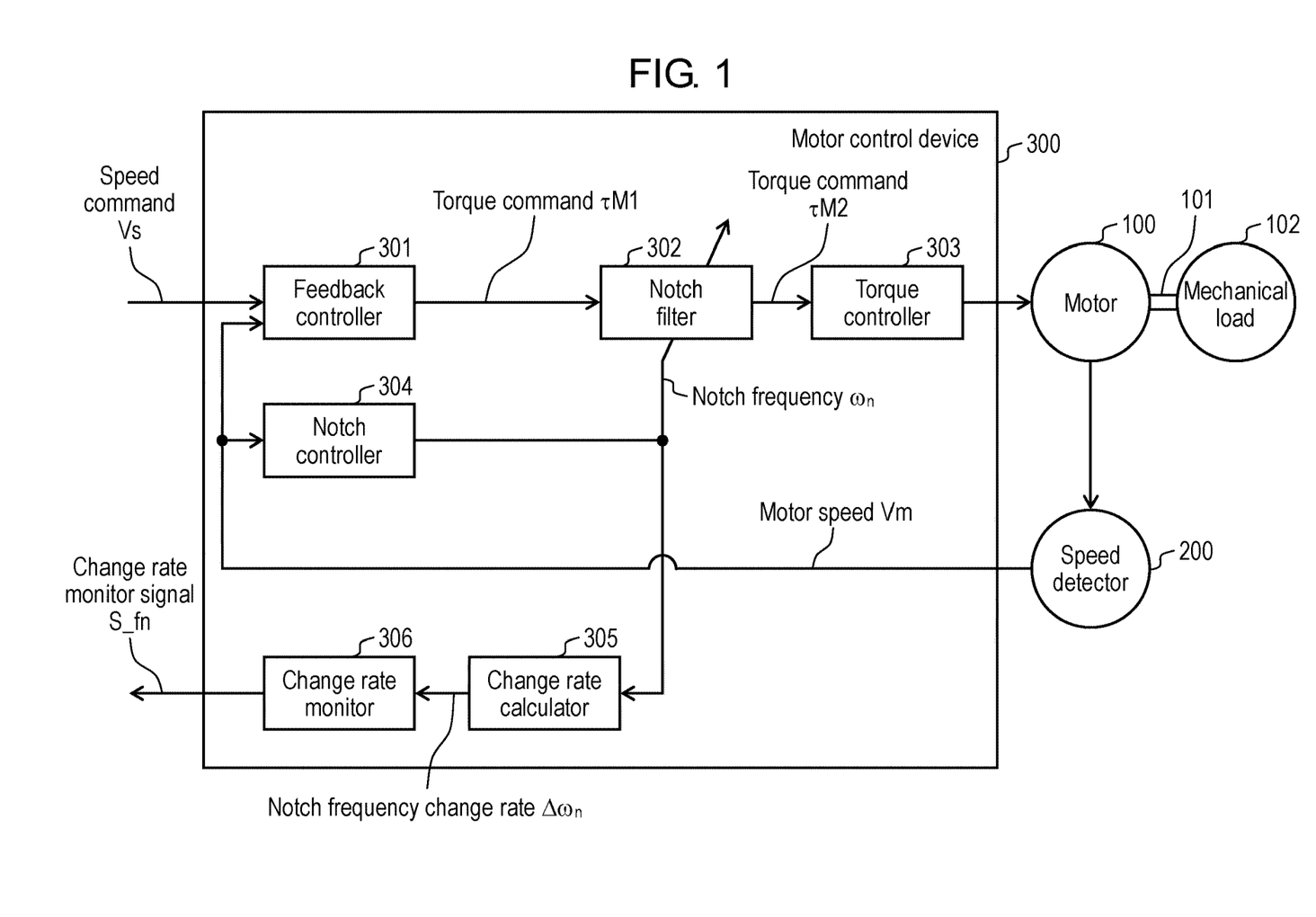
FIG. 1 is a block diagram depicting an exemplary configuration of a motor control device according to a first exemplary embodiment.

FIG. 1 is a block diagram depicting an exemplary configuration of motor control device 300 according to a first exemplary embodiment. Motor control device 300 feedback-controls state quantity of a motor. As depicted in FIG. 1, motor control device 300 is connected to motor 100 and speed detector 200. Motor control device 300 receives speed command Vs indicating desired operation of a mechanical load or the motor to be driven. Motor 100 is coupled with mechanical load 102 to be driven via joint 101. Speed detector 200 detects rotational speed of motor 100 and outputs motor speed Vm to motor control device 300. Feedback-controlling the state quantity of the motor can be replaced with feedback-controlling state quantity of the mechanical load.

Motor control device 300 includes feedback controller 301, notch filter 302 (notch filter 302 exemplifies the first notch filter), torque controller 303, notch controller 304 (notch controller 304 exemplifies the first notch controller), change rate calculator 305, and change rate monitor 306.

Feedback controller 301 receives motor speed Vm and speed command Vs and outputs torque command τM1 to zeroize difference between these values. For example, feedback controller 301 calculates a differential value between speed command Vs and motor speed Vm, and outputs, as torque command τM1, a result obtained by proportional integral of the calculated differential value.

Notch filter 302 is disposed inside a feedback control system and is configured to change a frequency component to be removed. In other words, notch filter 302 is configured to attenuate a signal component having a frequency around a specific frequency in an input signal, and output a result. A center frequency as an attenuation target will be called a notch frequency. Notch filter 302 receives torque command τM1 as an input signal. Notch filter 302 attenuates a signal component having a frequency around the notch frequency in torque command τM1, and outputs a result as new torque command τM2.

Torque controller 303 controls current applied to motor 100 or the like to match torque generated by motor 100 with torque command τM2.

Motor control device 300 configures the internal feedback control system to match speed command Vs with motor speed Vm in this manner. As described earlier, notch filter 302 is disposed inside the feedback control system of motor control device 300.

Notch filter 302 can be of a quadratic recursive type having transfer function $G_{n1}(s)$ as expressed in (formula 1).

$$G_{n1}(s) = \frac{s^2 + 2d_{n1}\zeta_{n1}\omega_{n1}s + \omega_{n1}^2}{s^2 + 2\zeta_{n1}\omega_{n1}s + \omega_{n1}^2} \quad \text{[Formula 1]}$$

In (Formula 1), $\omega_{n1}$ is a notch frequency coefficient of notch filter 302, $\zeta_{n1}$ is an attenuation coefficient indicating a frequency bandwidth as an attenuation target, and $d_{n1}$ is a notch depth coefficient indicating a degree of attenuation. Notch depth coefficient $d_{n1}$ satisfies $0 \le d_{n1} \le 1$. When $d_{n1}=1$ is satisfied, notch filter 302 has a gain characteristic of 0 [dB] at notch frequency $\omega_{n1}$. When $d_{n1}=0$ is satisfied, notch filter 302 has a gain characteristic of $-\infty$ [dB] at notch frequency $\omega_{n1}$.

Figure 2:
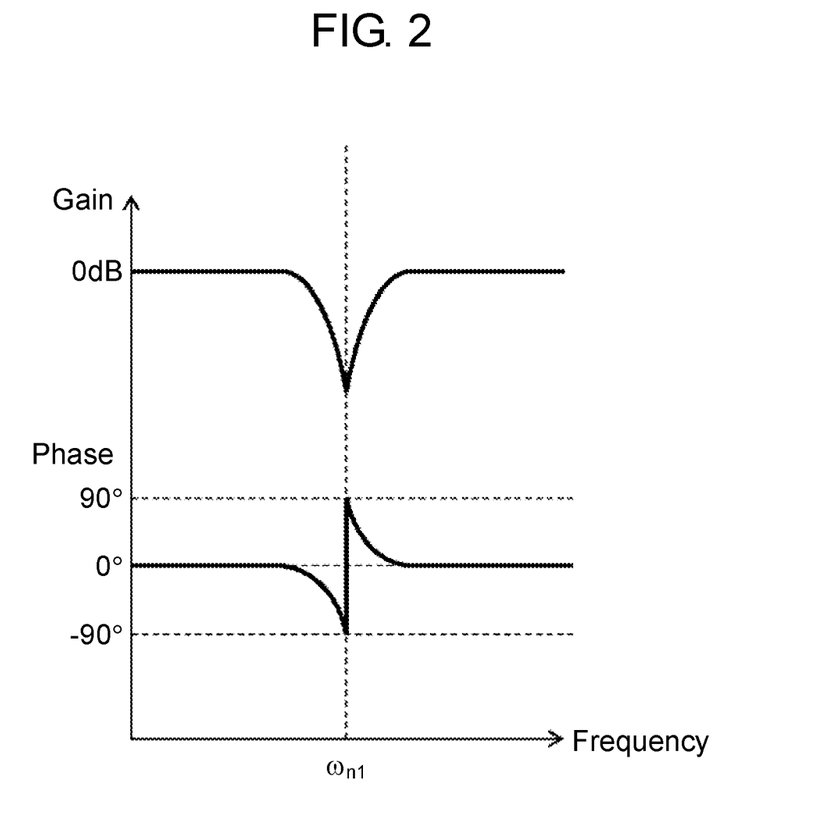
FIG. 2 is a graph indicating an exemplary frequency characteristic of a notch filter included in the motor control device according to the first exemplary embodiment.

FIG. 2 is a graph indicating an exemplary frequency characteristic of notch filter 302 included in motor control device 300 according to the first exemplary embodiment. FIG. 2 indicates a frequency characteristic of transfer function $G_{n1}(s)$ when $d_{n1}=0$ is satisfied. As apparent from FIG. 2, notch filter 302 has a characteristic of attenuating a component of notch frequency $\omega_{n1}$ and has the gain characteristic of $-\infty$. When an input signal includes a vibrational component, the input signal having an oscillation frequency disagreeing with notch frequency $\omega_{n1}$ has unattenuated amplitude and the input signal having an oscillation frequency agreeing with notch frequency $\omega_{n1}$ has attenuated amplitude. Notch filter 302 has a phase characteristic having a value from −90 degrees to 90 degrees. The phase characteristic has a negative value at a frequency equal to or less than the notch frequency, to effectively achieve phase delay of the input signal. Notch filter 302 is disposed inside the feedback control system, and a frequency equal to or less than the notch frequency leads to phase delay of the feedback control system due to such a phase delay effect of the notch filter. The notch filter itself can destabilize the feedback control system to cause oscillation when the notch frequency overlaps with a control band of the feedback control system. When the notch filter is used, the control band of the feedback control system has to be lower than the notch frequency to prevent the notch frequency from overlapping with the control band of the feedback control system.

As described above, notch filter 302 receives torque command τM1 and outputs new torque command τM2 obtained by attenuating a frequency component around notch frequency $\omega_{n1}$. Notch frequency $\omega_{n1}$ of notch filter 302 is variable and notch controller 304 changes notch frequency $\omega_{n1}$ to achieve agreement with the oscillation frequency upon occurrence of mechanical resonant vibration.

Notch controller 304 changes the notch frequency as the center frequency of notch filter 302 to achieve removal of a mechanical resonant vibrational component of the motor. Specifically, notch controller 304 changes the notch frequency of notch filter 302 to automatically achieve agreement with the oscillation frequency and outputs the changed notch frequency to change rate calculator 305.

Figure 3:
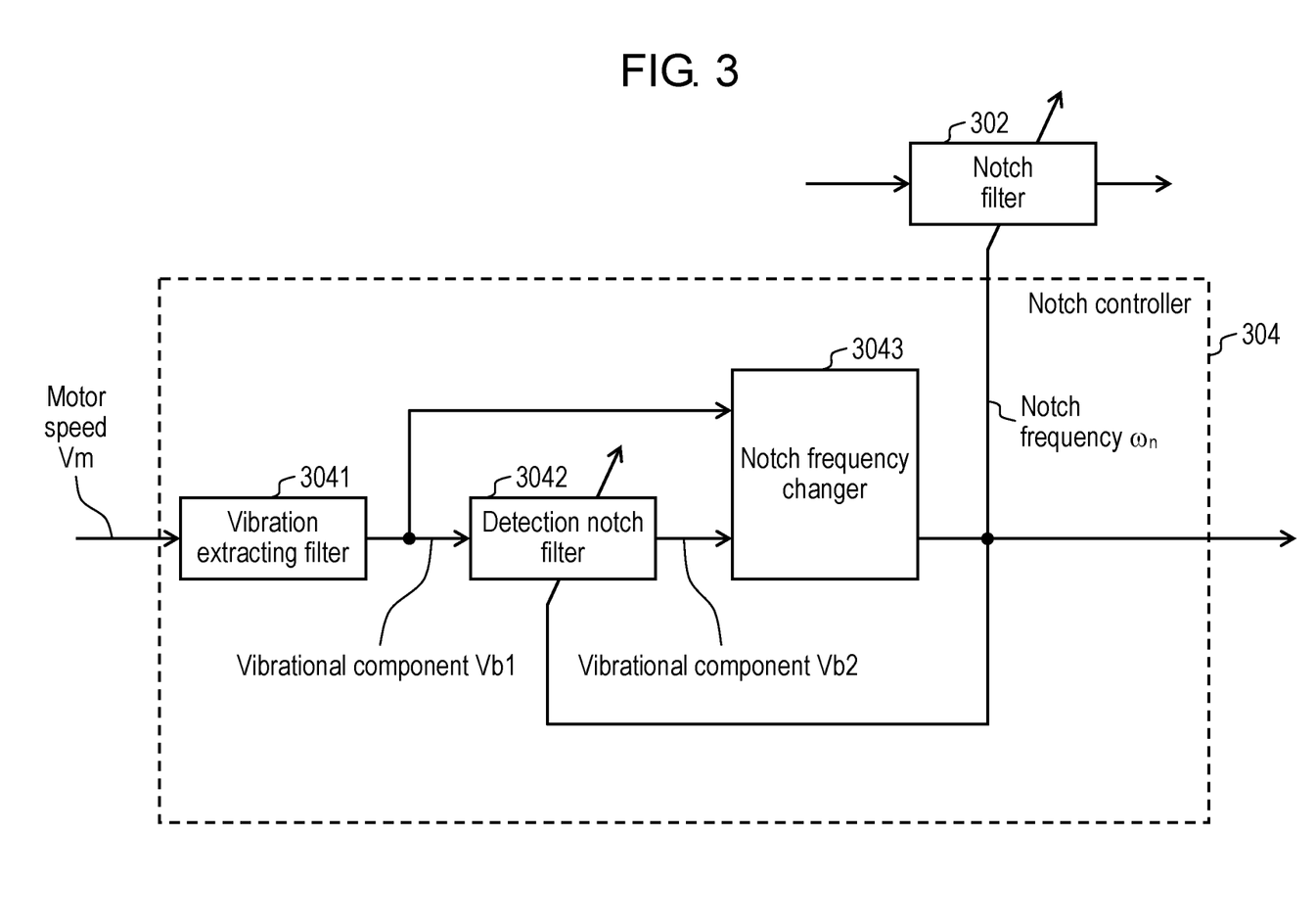
FIG. 3 is a block diagram depicting an exemplary configuration of a notch controller according to the first exemplary embodiment.

FIG. 3 is a block diagram depicting an exemplary configuration of notch controller 304 included in motor control device 300 according to the first exemplary embodiment. Notch controller 304 includes vibration extracting filter 3041, detection notch filter 3042, and notch frequency changer 3043. Notch controller 304 calculates an oscillation frequency when mechanical resonant vibration occurs. Notch controller 304 changes notch frequency $\omega_{n1}$ of notch filter 302 to the calculated oscillation frequency.

Vibration extracting filter 3041 extracts a predetermined frequency band component from an input signal and outputs the extracted component. Vibration extracting filter 3041 extracts a vibrational component of mechanical resonance or the like from motor speed Vm and outputs the extracted component as vibrational component Vb1. Vibration extracting filter 3041 has only to extract a vibrational component in this manner, and can thus be a high-pass filter configured to allow passage of a signal component having a frequency equal to or more than a predetermined frequency, or can be a bandpass filter configured to allow passage of a signal component within a predetermined frequency band.

Vibrational component Vb1 output from vibration extracting filter 3041 is received by detection notch filter 3042 and notch frequency changer 3043.

Detection notch filter 3042 attenuates a frequency component around the notch frequency as the center frequency in vibrational component Vb1 and outputs a result as new vibrational component Vb2. Detection notch filter 3042 allows the notch frequency to be changed by notch frequency changer 3043.

Detection notch filter 3042 according to the present exemplary embodiment is characterized by preliminarily having a predetermined value of a frequency bandwidth as an attenuation target. Assume that the notch filter has a gain characteristic of $-\infty$ [dB] at the notch frequency.

Detection notch filter 3042 is assumed to be of a quadratic recursive type having transfer function $G_{n2}(s)$ as expressed in (formula 2).

$$G_{n2}(s) = \frac{s^2 + \omega_{n2}^2}{s^2 + 2\zeta_{n2}\omega_{n2}s + \omega_{n2}^2}$$ [Formula 2]

Reference mark $\omega_{n1}$ indicates a notch frequency coefficient corresponding to the notch frequency of detection notch filter 3042. Reference mark $\zeta_{n2}$ indicates an attenuation coefficient. Detection notch filter 3042 has a frequency characteristic similar to the characteristic of notch filter 302 when $d_{n1}=0$ is satisfied and similar to the characteristic indicated in FIG. 2. Specifically, the frequency characteristic of detection notch filter 3042 is to attenuate a component of notch frequency $\omega_{n2}$. Notch frequency changer 3043 changes both notch frequency $\omega_{n1}$ of notch filter 302 and notch frequency $\omega_{n2}$ of detection notch filter 3042 to a frequency of vibration included in motor speed Vm.

Notch frequency changer 3043 receives vibrational component Vb1 and vibrational component Vb2 output from detection notch filter 3042 that allowed passage of vibrational component Vb1. Notch frequency changer 3043 generates notch frequency $\omega_n$ agreeing with the frequency of the vibration included in motor speed Vm. Notch frequency $\omega_n$ is supplied to notch filter 302 and detection notch filter 3042, and notch frequency $\omega_{n1}$ and notch frequency $\omega_{n2}$ are changed to $\omega_n$.

Amplitude of vibrational component Vb1 is not attenuated if the frequency of the vibrational component included in vibrational component Vb1 received by detection notch filter 3042 is largely different from notch frequency $\omega_{n2}$. The amplitude of vibrational component Vb1 is attenuated if the frequency of the vibrational component included in vibrational component Vb1 agrees with notch frequency $\omega_{n2}$. Vibrational component Vb2 thus has amplitude increased as an oscillation frequency of vibrational component Vb1 deviates from notch frequency $\omega_{n2}$. The amplitude of vibrational component Vb2 thus indicates a degree of deviation between the oscillation frequency of vibrational component Vb1 and notch frequency $\omega_{n2}$.

Notch frequency changer 3043 successively changes notch frequency con in accordance with the amplitude of vibrational component Vb1 and the amplitude of vibrational component Vb2 until the amplitude of vibrational component Vb2 becomes equal to or less than a predetermined value or reaches zero, and controls notch frequency $\omega_{n2}$ of detection notch filter 3042. Such control of the notch filter is achieved through combination of detection notch filter 3042, a directional filter disclosed in PTL 1 or the like, and a notch filter coefficient corrector.

Notch frequency $\omega_n$ is controlled in this manner to become equal to the frequency of the vibrational component included in vibrational component Vb1. Notch frequency $\omega_{n2}$ of detection notch filter 3042 and notch frequency $\omega_{n1}$ of notch filter 302 are both changed to achieve agreement with notch frequency con. In other words, notch frequency $\omega_{n1}$ and notch frequency $\omega_{n2}$ are controlled to become equal to the frequency of the vibrational component included in vibrational component Vb1.

As described above, notch controller 304 successively executes automatic change of notch frequency $\omega_{n1}$ of notch filter 302 to achieve agreement with the frequency of the vibrational component when motor speed Vm includes a vibrational component due to mechanical resonance.

Change rate calculator 305 successively calculates a notch frequency change rate indicating a change amount per unit time of a notch frequency. Specifically, change rate calculator 305 receives notch frequency $\omega_{n1}$ controlled by notch controller 304 to achieve agreement with the frequency of the vibrational component. Change rate calculator 305 calculates a differential value as a change amount between the notch frequency at previous time and the notch frequency at current time every time predetermined unit time elapses, and outputs, to change rate monitor 306, the differential value as notch frequency change rate $\Delta\omega_n$ per unit time. The unit time for output of notch frequency change rate $\Delta\omega_n$ has a fixed value, and can be equal to a successive change period of notch frequency $\omega_n$ at notch controller 304 or can be longer than the successive change period if a mechanical resonant frequency changes moderately.

When the notch frequency change rate calculated by change rate calculator 305 has a value outside a predetermined range preliminarily set, change rate monitor 306 outputs a signal indicating that the notch frequency change rate has such a value outside the predetermined range. Specifically, change rate monitor 306 determines whether or not notch frequency change rate $\Delta\omega_n$ thus received has a value outside the predetermined range and outputs a signal indicating a determination result as change rate monitor signal S_fn. Notch controller 304 controls notch frequency $\omega_n$ to achieve agreement with the mechanical resonant frequency, so that the change amount per unit time of the notch frequency is equal to the change amount per unit time of the mechanical resonant frequency. Specifically, change rate monitor 306 determines whether or not the change amount per unit time of the mechanical resonant frequency has a value outside the predetermined range and outputs a determination result as change rate monitor signal S_fn.

Mechanical equipment is subjected to regular maintenance for prevention of equipment abnormality. If the change amount per unit time of the mechanical resonant frequency is sufficiently small, such regular maintenance of the equipment achieves prevention of abnormal operation due to change in mechanical resonant frequency. If the change amount per unit time of the mechanical resonant frequency increases for some reason, abnormal operation due to change in mechanical resonant frequency may occur before execution of such regular maintenance of the equipment. Motor control device 300 according to the present exemplary embodiment includes change rate monitor 306 configured to monitor the change amount per unit time of the mechanical resonant frequency, to enable detection of a sign of abnormal operation due to change in mechanical resonant frequency, which has hardly been prevented by such regular maintenance of the equipment as described above.

Specifically, in an exemplary case where notch frequency change rate $\Delta\omega_n$ has an absolute value exceeding a predetermined threshold, for example, change rate monitor 306 can output change rate monitor signal S_fn equal to one. In another case where the absolute value of notch frequency change rate $\Delta\omega_n$ is equal to or less than the predetermined threshold, change rate monitor 306 can output change rate monitor signal S_fn equal to zero. Switching the change rate monitor signal in accordance with notch frequency change rate $\Delta\omega_n$ thus achieves detection of a sign of abnormal operation due to change in mechanical resonant frequency. As an example, with a lamp configured to be lighted when change rate monitor signal S_fn changes from zero to one, a user can recognize that notch frequency change rate $\Delta\omega_n$ exceeds the predetermined threshold by visually checking the lighted lamp.

In motor control device 300 thus configured in accordance with the present exemplary embodiment, even when notch controller 304 and notch filter 302 suppresses mechanical resonant vibration, notch frequency change rate $\Delta\omega_n$ as the change amount per unit time of the mechanical resonant frequency exceeding the predetermined range can be recognized by means of change rate monitor signal S_fn. A system including motor control device 300 thus enables the user to recognize a sign of abnormal operation occurrence due to change in mechanical resonant frequency.

As described above, motor control device 300 according to the present exemplary embodiment outputs a notification signal when the mechanical resonant frequency changes to have the change amount per unit time having a value outside the predetermined range, to enable the user to recognize a sign of abnormal operation occurrence due to change in mechanical resonant frequency.

Change rate monitor 306 according to the present exemplary embodiment has the single threshold for determination of the notch frequency change rate, but may alternatively adopt a plurality of thresholds. For example, change rate monitor 306 may have a first predetermined value and a second predetermined value more than the first predetermined value, as thresholds for determination of the notch frequency change rate. The change rate monitor signal may indicate whether the notch frequency change rate is less than the first predetermined value, is equal to or more than the first predetermined value and less than the second predetermined value, or is more than the second predetermined value. Such a configuration enables the user to recognize a degree of change in mechanical resonant frequency when the system including motor control device 300 according to the present exemplary embodiment has change in mechanical resonant frequency. Furthermore, the notch frequency change rate may alternatively be determined in accordance with a threshold for an increased notch frequency and a threshold for a decreased notch frequency set separately from each other. Increase and decrease in notch frequency influence operation differently from each other. Such a configuration enables the user to recognize a sign of abnormal operation occurrence in accordance with an influence of the change in notch frequency on the operation in the system including motor control device 300.

Change rate calculator 305 according to the present exemplary embodiment has the fixed unit time (i.e., a sampling period) for calculation of the notch frequency change rate, but may alternatively have unit time changed in accordance with the notch frequency change rate. For example, change rate calculator 305 may preliminarily have a first threshold equal to the threshold of change rate monitor 306 and a second threshold less than the first threshold, and the sampling period may be set longer if the notch frequency change rate is equal to or less than the second threshold and may be set shorter if the notch frequency change rate is more than the second threshold. Upon change in sampling period, the threshold of change rate monitor 306 and the first and second thresholds of change rate calculator 305 may alternatively be changed in proportion to a change rate of the sampling period. Such switching of the sampling period for calculation of the notch frequency change rate or the threshold for determination of the change rate monitor signal in accordance with the notch frequency change rate allows the change rate monitor to promptly output the change rate monitor signal indicating that the notch frequency change rate exceeds the predetermined threshold even in an exemplary case where the notch frequency change rate changes suddenly. The system including motor control device 300 thus enables the user to recognize at a shorter time interval a sign of abnormal operation occurrence due to change in mechanical resonant frequency.

The present exemplary embodiment provides notch filter 302 disposed inside the feedback control system and having the notch frequency controlled to constantly become equal to the frequency of vibration included in motor speed. Possible values of the notch frequency may alternatively be limited by upper and lower limit values to prevent the notch frequency of the notch filter disposed inside the feedback control system from overlapping with the control band of the feedback system. Such a configuration prevents the control band of the feedback control system from overlapping with the notch frequency of the notch filter disposed inside the feedback control system. This accordingly prevents oscillation caused by unstability of the feedback control system.

Notch controller 304 according to the present exemplary embodiment is configured to achieve agreement between notch frequency $\omega_{n1}$ of notch filter 302 and the frequency of mechanical resonant vibration. Notch controller 304 is not limitedly configured to achieve perfect agreement between notch frequency $\omega_{n1}$ of notch filter 302 and the mechanical resonant frequency, if notch filter 302 can effectively remove the frequency of the mechanical resonant vibration.

Constituent elements of motor control device 300, namely, feedback controller 301, notch filter 302, torque controller 303, notch controller 304, change rate calculator 305, and change rate monitor 306 may each be achieved by an analog circuit or a digital circuit including dedicated hardware. The constituent elements may alternatively be achieved by execution of a program stored in a memory by a processor in a computer device including the memory and the processor.

Second Exemplary Embodiment

Figure 4:
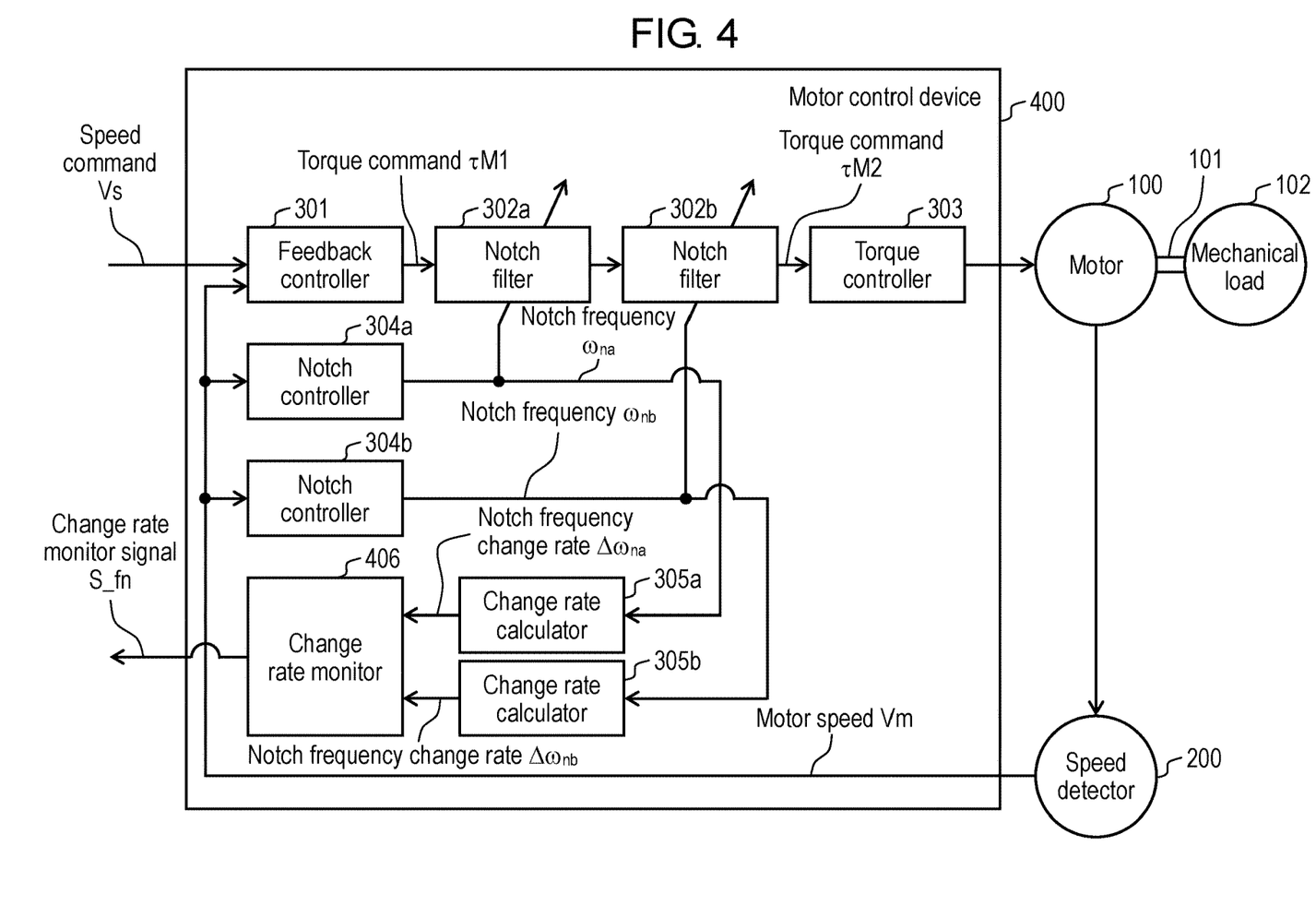
FIG. 4 is a block diagram depicting an exemplary configuration of a motor control device according to a second exemplary embodiment.

FIG. 4 is a block diagram depicting an exemplary configuration of motor control device 400 according to a second exemplary embodiment. Constituent elements depicted in FIG. 4 as well as functioned and configured to operate similarly to the constituent elements in FIG. 1 according to the first exemplary embodiment will be denoted by identical reference marks and will not repeatedly be described in terms of operation. As depicted in FIG. 4, motor control device 400 according to the second exemplary embodiment is obtained by increasing a number from one to two, of each of the notch filter, the notch controller, and the change rate calculator included in the configuration depicted in FIG. 1.

Motor control device 400 is configured to reduce vibration even when there are two mechanical resonant frequencies, by including notch filter 302a (notch filter 302a exemplifies the first notch filer) for notch frequency $\omega_{n1a}$ and notch filter 302b (notch filter 302b exemplifies the second notch filer) for notch frequency $\omega_{n1b}$. Notch filter 302a and notch filter 302b are connected in series and are disposed downstream of feedback controller 301.

Notch filter 302a and notch filter 302b are configured similarly to notch filter 302 according to the first exemplary embodiment.

Notch frequency $\omega_{n1a}$ and notch frequency $\omega_{n1b}$ are set to have values different from each other to each correspond to one of the two mechanical resonant frequencies. For change of the notch frequencies of the respective notch filters, motor control device 400 includes notch controller 304a (notch controller 304a exemplifies the first notch controller) for notch filter 302a, and notch controller 304b (notch controller 304b exemplifies the second notch controller) for notch filter 302b provided separately from notch controller 304a.

Notch controller 304a and notch controller 304b are configured similarly to notch controller 304 according to the first exemplary embodiment. When the two mechanical resonant frequencies each change, notch controller 304a and notch controller 304b each change vibration caused by change in corresponding mechanical resonant frequency to achieve agreement with a frequency of a vibrational component generating the notch frequency of the corresponding notch filter. Notch controller 304a and notch controller 304b simultaneously output, to change rate calculator 305a and change rate calculator 305b, respectively, the notch frequencies thus changed.

In order to cause notch controller 304a and notch controller 304b to detect change of the mechanical resonant frequencies different from each other, the notch controllers may include vibration extracting filters having passbands provided around the two different mechanical resonant frequencies and not overlapping with each other, for example. Notch controller 304a and notch controller 304b can thus control notch filter 302a and notch filter 302b to achieve agreement between the frequency of vibration caused by change in corresponding mechanical resonant frequency and the notch frequency of the corresponding notch filter, without being influenced by the change of the other mechanical resonant frequency.

Change rate calculator 305a and change rate calculator 305b each output, to change rate monitor 406, the change amount per unit time of the notch frequency output from the corresponding notch controller, as notch frequency change rate $\Delta\omega_{na}$ or notch frequency change rate $\Delta\omega_{nb}$.

Change rate monitor 406 determines whether or not notch frequency change rate $\Delta\omega_{na}$ and notch frequency change rate $\Delta\omega_{nb}$ thus received each have an absolute value exceeding a predetermined threshold set for the corresponding notch frequency change rate $\Delta\omega_{na}$ or $\Delta\omega_{nb}$, and outputs a determination result as change rate monitor signal S_fn. For example, it is assumed that change rate monitor signal S_fn is one if at least one of notch frequency change rate $\Delta\omega_{na}$ and notch frequency change rate $\Delta\omega_{nb}$ has an absolute value exceeding the correspondingly set threshold, and change rate monitor signal S_fn is zero if each of notch frequency change rate $\Delta\omega_{na}$ and notch frequency change rate $\Delta\omega_{nb}$ has an absolute value not exceeding the corresponding threshold.

A system including motor control device 400 thus configured achieves output of a notification signal when there are two mechanical resonant frequencies at least one of which changes to have a notch frequency change rate exceeding a predetermined range, to enable a user to recognize a sign of abnormal operation occurrence due to change in mechanical resonant frequency.

As described above, motor control device 400 according to the present exemplary embodiment outputs a notification signal when there are two mechanical resonant frequencies at least one of which changes to have a change amount per unit time having a value outside the predetermined range. The system including motor control device 400 thus enables the user to recognize a sign of abnormal operation occurrence due to change in mechanical resonant frequency.

The present exemplary embodiment provides the configuration including the two sets of the notch filters, the notch controllers, and the change rate calculators. The present invention is also applicable to a configuration including three sets of these constituent elements. The notch filters, the notch controllers, and the change rate monitors may operate similarly in this case. Such a configuration achieves output of a notification signal even when there are three or more mechanical resonant frequencies at least one of which changes to have a change amount per unit time having a value outside the predetermined range. The system including motor control device 400 according to the present exemplary embodiment thus enables the user to recognize a sign of abnormal operation occurrence due to change in mechanical resonant frequency.

Constituent elements of motor control device 400, namely, feedback controller 301, notch filter 302a, notch filter 302b, torque controller 303, notch controller 304a, notch controller 304b, change rate calculator 305a, change rate calculator 305b, and change rate monitor 406 may each be achieved by an analog circuit or a digital circuit including dedicated hardware. The constituent elements may alternatively be achieved by execution of a program stored in a memory by a processor in a computer device including the memory and the processor.

Third Exemplary Embodiment

Figure 5:
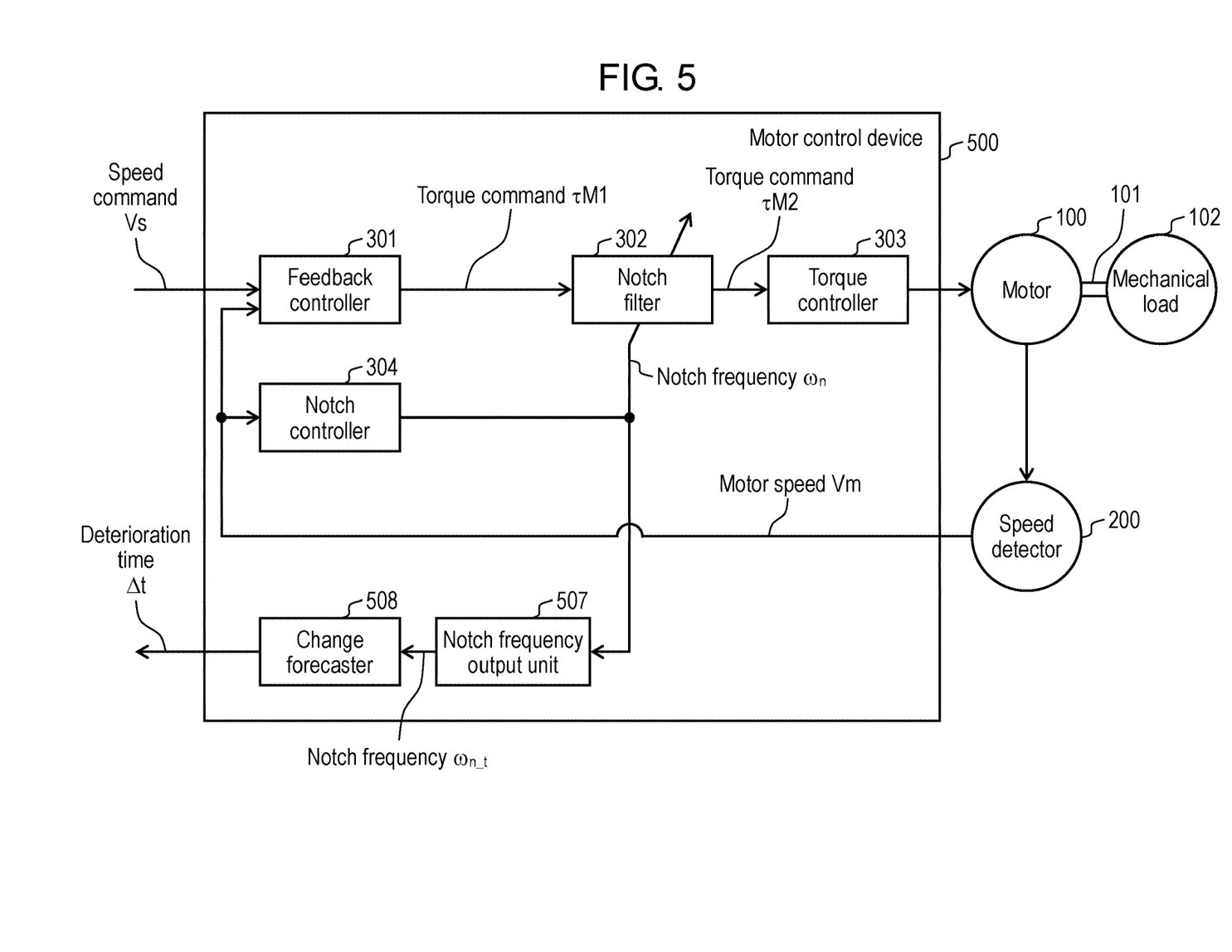
FIG. 5 is a block diagram depicting an exemplary configuration of a motor control device according to a third exemplary embodiment.

FIG. 5 is a block diagram depicting an exemplary configuration of motor control device 500 according to the third exemplary embodiment. Constituent elements depicted in FIG. 5 as well as functioned and configured to operate similarly to the constituent elements in FIG. 1 according to the first exemplary embodiment will be denoted by identical reference marks and will not repeatedly be described in terms of operation. As depicted in FIG. 5, motor control device 500 according to the third exemplary embodiment is obtained by replacing change rate calculator 305 and change rate monitor 306 included in the configuration depicted in FIG. 1 with notch frequency output unit 507 and change forecaster 508 newly provided. Notch controller 304 outputs notch frequency $\omega_n$ that is received by notch filter 302 and notch frequency output unit 507.

Notch frequency output unit 507 samples the notch frequency appropriately changed by notch controller 304. Specifically, notch frequency output unit 507 outputs notch frequency $\omega_{n\_t}$ at a unit time period (i.e., the sampling period) longer than the successive change period of notch frequency $\omega_n$ that is received by notch controller 304 at the successive change period of notch frequency $\omega_n$.

Change forecaster 508 calculates to output, in accordance with notch frequencies at a plurality of past time points, a forecast value of elapsed time from current time until the notch frequency is to become out of a specific frequency range, and a forecast value of elapsed time from current time to time when the notch frequency is to become out of the specific frequency range. Change forecaster 508 has an allowable lower limit value of the mechanical resonant frequency preset within a range not causing abnormal operation of the mechanical equipment. Change forecaster 508 receives notch frequency $\omega_{n\_t}$ output from notch frequency output unit 507 every time the unit time elapses. Change forecaster 508 executes forecasting calculation of time from current time until the mechanical resonant frequency reaches the preset lower limit value, in accordance with notch frequency $\omega_{n\_t}$ thus received. Change forecaster 508 outputs time forecast value Δt from current time to abnormal operation occurrence.

Figure 6:
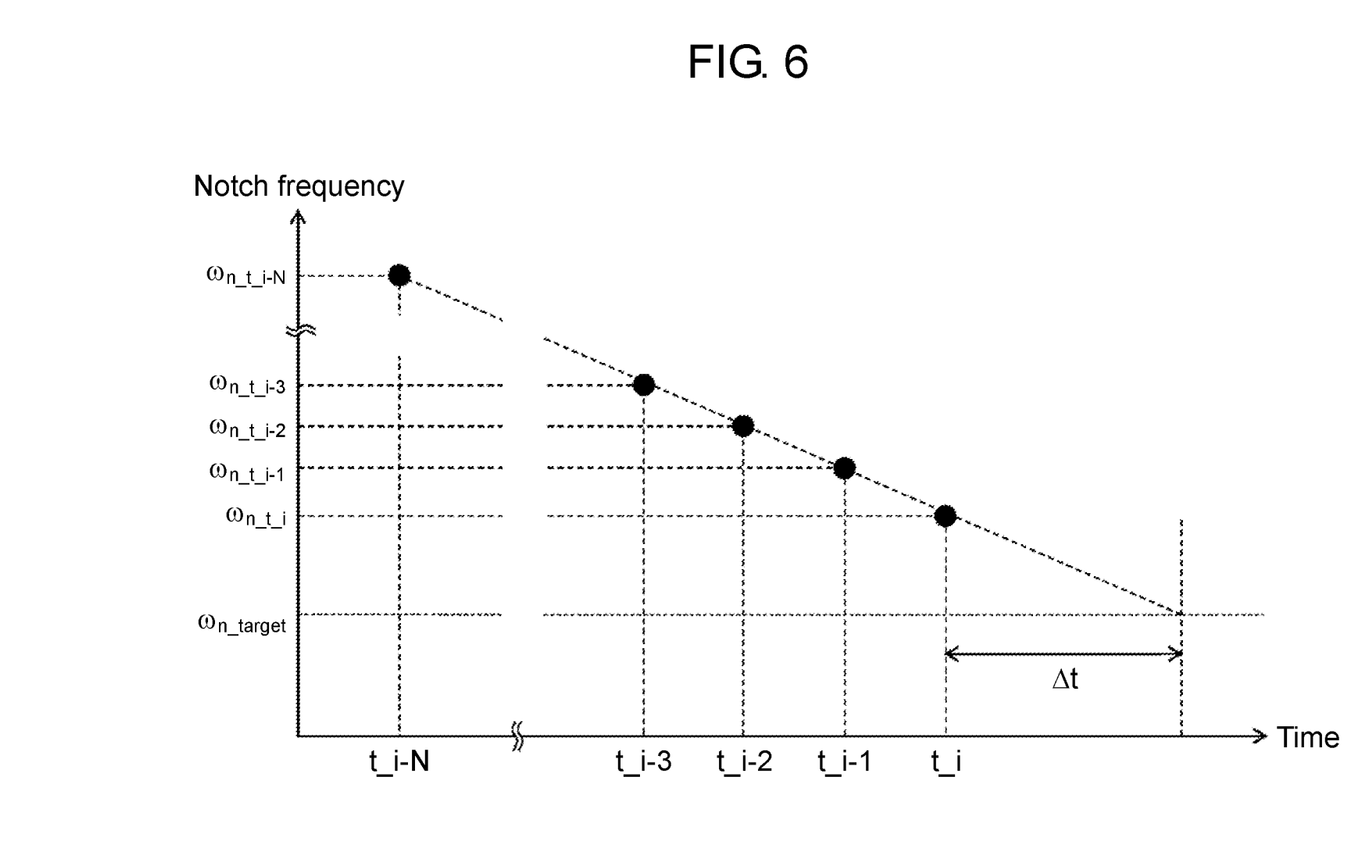
FIG. 6 is a graph indicating summarized forecasting calculation executed by a change forecaster included in the motor control device according to the third exemplary embodiment.

The forecasting calculation of time forecast value Δt by change forecaster 508 will be described in detail. FIG. 6 is a graph indicating summarized forecasting calculation executed by change forecaster 508 included in motor control device 500 according to the third exemplary embodiment. FIG. 6 includes a transverse axis indicating time and an ordinate axis indicating a notch frequency. FIG. 6 indicates input of notch frequency $\omega_{n\_t\_i}$ at current time t_i. Change forecaster 508 receives notch frequency $\omega_n$ at every sampling period. Notch frequency $\omega_{n\_t\_i-1}$ is input at previous time t_i−1, and notch frequency $\omega_{n\_t\_i-2}$ is input at further previous time t_i−2. The notch frequency at time before the further previous time is input similarly. The notch frequency initially received by change forecaster 508 is denoted by $\omega_{n\_t\_i-N}$. FIG. 6 indicates exemplary change in notch frequency, that notch frequency $\omega_{n\_t}$ gradually decreases as time elapses. The mechanical resonant frequency has a lower limit value $\omega_{n\_target}$ set to provide a range not causing abnormal operation of the mechanical equipment.

Change forecaster 508 calculates time forecast value Δt from current time t_i until the mechanical resonant frequency reaches preset lower limit value $\omega_{n\_target}$ in accordance with preset lower limit value $\omega_{n\_target}$ of the mechanical resonant frequency, $\omega_{n\_t\_i-X}$ (X=0, 1, 2, . . . , having been input at certain time t_i, and sampling period Ts for input of notch frequency $\omega_{n\_t\_i}$ to change forecaster 508. In other words, reference mark Δt indicates a time forecast value from current time until the mechanical resonant frequency reaches the allowable lower limit value of the range not causing abnormal operation. Time forecast value Δt can be calculated in accordance with (formula 3) and (formula 4).

$$\Delta t = \frac{|\omega_{n\_t\_i} - \omega_{n\_target}|}{\sum_{X=0}^{N-1} \Delta \omega_{n\_i-X} / N} \times T_s \quad \text{[Formula 3]}$$

$$\Delta \omega_{n\_i-X} = \omega_{n\_t\_i-X} - \omega_{n\_t\_i-X+1} \quad \text{[Formula 4]}$$
$(X = 0, 1, 2, \ldots N - 1)$ In (formula 3), $\Delta\omega_{n\_j-X}$ (X=0, 1, 2, . . . N−1) indicates a change amount of the notch frequency per sampling period at each time and is calculated in accordance with (formula 4). A right side of (formula 3) includes a fractional term to be multiplied to sampling period Ts and having a denominator term indicating an average value of change amounts per sampling period of the notch frequencies having been input. The fractional term has a numerator term indicating difference between notch frequency $\omega_{n\_t\_i}$ at time t_i and preset lower limit value $\omega_{n\_target}$. Accordingly, (formula 3) indicates calculation according to linear interpolation, of time from current time t_i until the notch frequency reaches preset lower limit value $\omega_{n\_target}$ with respect to the notch frequencies having been input until current time.

The above configuration achieves highly accurate calculation prior to abnormal operation occurrence, of time until the mechanical resonant frequency reaches the allowable lower limit value of the range not causing abnormal operation, in accordance with the notch frequencies until current time in the case where mechanical resonant vibration is suppressed constantly and the mechanical resonant frequency varies. This enables notification to a user, prior to occurrence due to change in mechanical resonant frequency, of time to abnormal operation occurrence to provide an alert to change in mechanical resonant frequency or maintenance of the equipment.

As described above, motor control device 500 according to the present exemplary embodiment forecasts to output time until the changing mechanical resonant frequency reaches the allowable lower limit value of the range not causing abnormal operation, in accordance with change in mechanical resonant frequency until current time. A system including motor control device 500 thus enables a user to recognize a sign of abnormal operation occurrence due to change in mechanical resonant frequency.

Motor control device 500 according to the present exemplary embodiment is configured to calculate time until the mechanical resonant frequency reaches the allowable lower limit value of the range not causing abnormal operation, in accordance with change in notch frequency until current time. Motor control device 500 may alternatively be configured to preset an allowable upper limit value of the mechanical resonant frequency within the range not causing abnormality of the mechanical equipment and calculate also a time forecast value until the mechanical resonant frequency reaches the upper limit value thus set. Motor control device 500 may still alternatively be configured to preset allowable upper and lower limit values of the mechanical resonant frequency within the range not causing abnormality of the mechanical equipment and calculate a time forecast value until the mechanical resonant frequency reaches either one of the upper and lower limit values thus set. Such configurations achieve constant calculation of time until the mechanical resonant frequency reaches the allowable upper or lower limit value of the range not causing abnormal operation due to change in mechanical resonant frequency, regardless of whether the mechanical resonant frequency decreases or increases.

The present exemplary embodiment provides the configuration for calculation of the time forecast value until abnormal operation occurrence by applying linear interpolation to all the notch frequencies input until current time, as in (formula 3). Alternatively, the notch frequency at time closer to current time may be likely to be reflected in the forecasting calculation. Linear interpolation may include multiplication of the change amount of the notch frequency per unit time by a weighting factor depending on time difference from current time. Such a configuration achieves more accurate calculation of the time forecast value until abnormal operation occurrence.

The present exemplary embodiment provides the configuration for forecasting calculation of time until abnormal operation occurrence by applying linear interpolation to the notch frequencies until current time, as in (formula 3). The present exemplary embodiment may adopt a measure other than linear interpolation. The notch frequencies may alternatively be fit to a quadratic function curve, an exponential curve, or a logarithmic curve. In a case where the mechanical resonant frequency changes with a known tendency, the forecasting calculation can be executed in accordance with a formula conforming to the tendency. Such a configuration achieves more accurate calculation of the time forecast value until abnormal operation occurrence.

The present exemplary embodiment provides change forecaster 508 configured to output the time forecast value until abnormal operation occurrence. Change forecaster 508 may alternatively be configured to output the notch frequency after preset predetermined time. The notch frequency after the preset predetermined time can be calculated in accordance with a method, examples of which include linear interpolation of the notch frequencies until current time, similarly to forecast of time from current time until the mechanical resonant frequency reaches the preset lower limit value. Still alternatively, change forecaster 508 may be configured to output both the time forecast value until abnormal operation occurrence and the notch frequency after the predetermined time, in accordance with the notch frequencies until current time.

Change forecaster 508 may be configured to output a time point forecast value when abnormal operation occurs, in place of the time forecast value until abnormal operation occurrence.

The present exemplary embodiment provides notch frequency output unit 507 configured to output the notch frequency at every predetermined sampling period. Notch frequency output unit 507 may alternatively be configured to output the notch frequency at every sampling period only during continuous operation time. The time forecast value until abnormal operation occurrence to be output by change forecaster 508 may be a forecast value of the continuous operation time until abnormal operation occurrence. Such configurations enable the user to recognize a sign of abnormal operation occurrence due to change in mechanical resonant frequency in the system including motor control device 500 even in the case where the mechanical equipment frequently repeats driving and halting.

The present exemplary embodiment provides notch filter 302 disposed inside the feedback control system and having the notch frequency controlled to constantly become equal to the frequency of vibration included in motor speed. Possible values of the notch frequency may alternatively be limited by upper and lower limit values to prevent the notch frequency of notch filter 302 disposed inside the feedback control system from overlapping with the control band of the feedback system. The lower limit value of the notch frequency in this case may be set to be larger than the control band of the feedback control system. Such a configuration prevents the control band of the feedback control system from overlapping with the notch frequency of notch filter 302 disposed inside the feedback control system. This accordingly prevents oscillation caused by unstability of the feedback control system.

Constituent elements of motor control device 500, namely, feedback controller 301, notch filter 302, torque controller 303, notch controller 304, notch frequency output unit 507, and change forecaster 508 can each be achieved by an analog circuit or a digital circuit including dedicated hardware. The constituent elements may alternatively be achieved by execution of a program stored in a memory by a processor in a computer device including the memory and the processor.

Fourth Exemplary Embodiment

Figure 7:
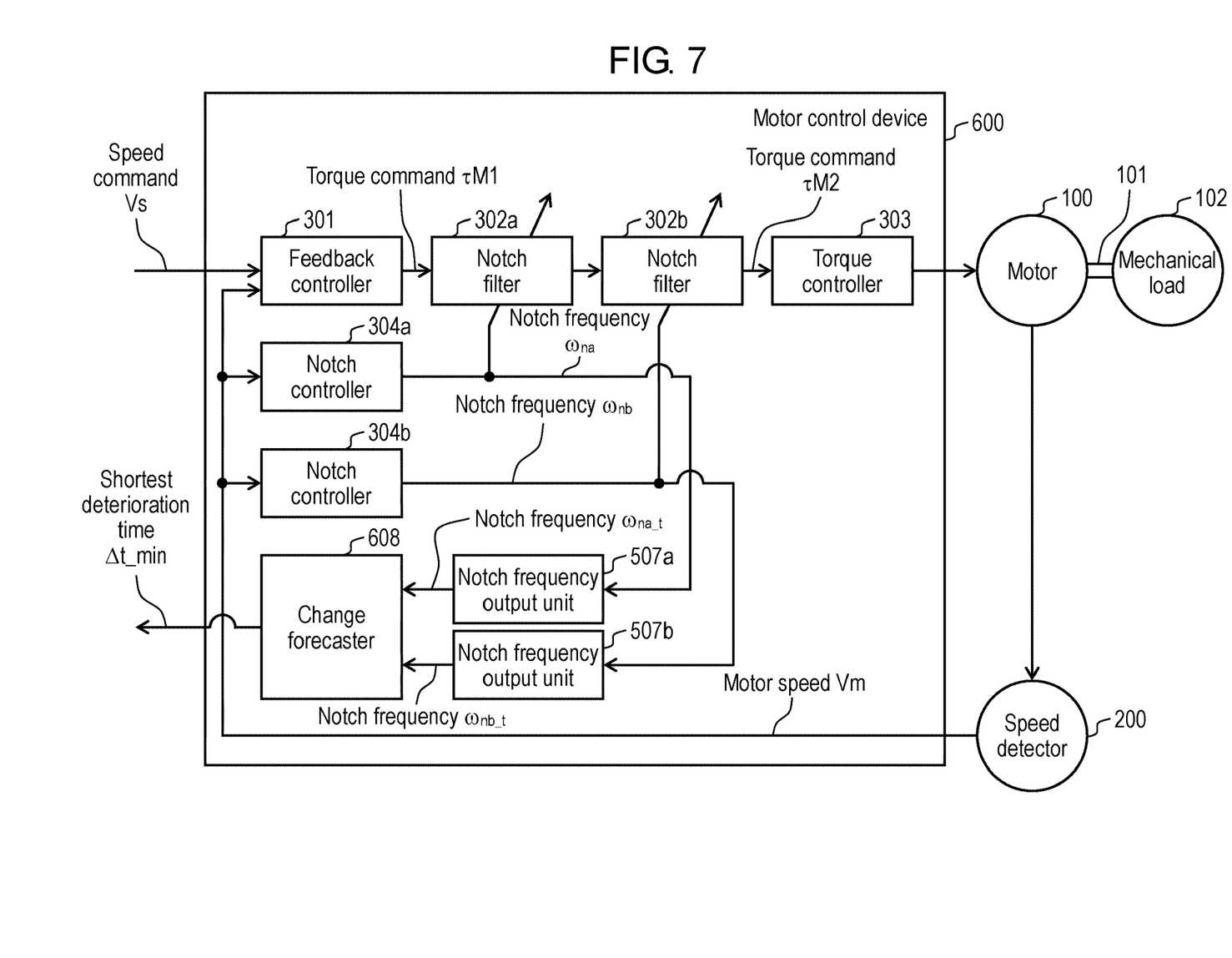
FIG. 7 is a block diagram depicting an exemplary configuration of a motor control device according to a fourth exemplary embodiment.

FIG. 7 is a block diagram depicting an exemplary configuration of motor control device 600 according to a fourth exemplary embodiment. Constituent elements depicted in FIG. 7 as well as functioned and configured to operate similarly to the constituent elements in FIG. 5 according to the third exemplary embodiment will be denoted by identical reference marks and will not repeatedly be described in terms of operation. As depicted in FIG. 7, motor control device 600 according to the fourth exemplary embodiment is obtained by increasing a number from one to two, of each of the notch filter, the notch controller, and the notch frequency output unit included in the configuration depicted in FIG. 5.

Motor control device 600 is configured to reduce vibration even when there are two mechanical resonances, by including notch filter 302a for notch frequency $\omega_{n1a}$ and notch filter 302b for notch frequency $\omega_{n1b}$. Notch filter 302a and notch filter 302b are connected in series and are disposed downstream of feedback controller 301. Notch frequency $\omega_{n1a}$ and notch frequency $\omega_{n1b}$ are set to have values different from each other to each correspond to one of the two mechanical resonant frequencies. For change of the notch frequencies of the respective notch filters, there are separately provided notch controller 304a for notch filter 302a, and notch controller 304b for notch filter 302b. When the two mechanical resonant frequencies each change, notch controller 304a and notch controller 304b each change the notch frequency of the corresponding notch filter to the changed mechanical resonant frequency in accordance with change in corresponding mechanical resonant frequency. Notch controller 304a and notch controller 304b simultaneously output the notch frequencies to notch frequency output unit 507a and notch frequency output unit 507b, respectively. In order to cause notch controller 304a and notch controller 304b to detect change of the mechanical resonant frequencies different from each other, the notch controllers may include vibration extracting filters having passbands provided around the two different mechanical resonant frequencies and not overlapping with each other, for example. Notch controller 304a and notch controller 304b can thus each detect change in corresponding mechanical resonant frequency, without being influenced by the change of the other mechanical resonant frequency.

Notch frequency output unit 507a and notch frequency output unit 507b correspond to notch controller 304a and notch controller 304b, respectively. Notch frequency output unit 507a and notch frequency output unit 507b each output, to change forecaster 608 at every predetermined sampling period, the notch frequency output from the corresponding notch controller, as notch frequency $\omega_{na\_t}$ or notch frequency $\omega_{nb\_t}$.

Change forecaster 608 has allowable upper and lower limit values of each of the mechanical resonant frequencies corresponding to notch controller 304a and notch controller 304b and preset within a range not causing abnormal operation. Change forecaster 608 calculates each of time forecast values Δta and Δtb until the notch frequency reaches the upper or lower limit value in accordance with the notch frequencies until current time, received at every sampling period from notch frequency output unit 507a and notch frequency output unit 507b. A smaller one of time forecast values Δta and Δtb thus calculated is output as time forecast value Δt_min from current time until the mechanical equipment has abnormal operation. Time forecast value Δta, Δtb can separately be calculated from the corresponding notch frequencies until current time, in accordance with a method similar to the calculation method exemplified in the third exemplary embodiment.

The above configuration achieves highly accurate forecast of time from current time until abnormal operation occurrence due to change in mechanical resonant frequency, even when there are two mechanical resonant frequencies. A system including motor control device 600 thus enables a user to recognize a sign of abnormal operation occurrence due to change in mechanical resonant frequency.

As described above, even when there are two mechanical resonant frequencies, motor control device 600 according to the present exemplary embodiment forecasts time until each of the two mechanical resonant frequencies reaches the allowable upper or lower limit value of the range not causing abnormal operation, in accordance with change of the mechanical resonant frequencies until current time, and outputs a shorter one of the forecasted time. The system including motor control device 600 thus enables the user to recognize a sign of abnormal operation occurrence due to change in mechanical resonant frequency.

The present exemplary embodiment provides the configuration including the two sets of the notch filters, the notch controllers, and the notch frequency output units, assuming that there two mechanical resonant frequencies. The present invention is also applicable to a configuration including three or more sets of these constituent elements. The notch filters, the notch controllers, the notch frequency output units, and the change forecaster in this case may operate similarly to those according to the fourth exemplary embodiment. Such a configuration achieves, even when there are three or more mechanical resonant frequencies, forecast and output of shortest time until either one of the changing mechanical resonant frequencies reaches the allowable upper or lower limit value of the range not causing abnormal operation, in accordance with change in mechanical resonant frequency until current time. The system including the motor control device according to the present exemplary embodiment thus enables the user to recognize a sign of abnormal operation occurrence due to change in mechanical resonant frequency.

Constituent elements of motor control device 600, namely, feedback controller 301, notch filter 302a, notch filter 302b, torque controller 303, notch controller 304a, notch controller 304b, notch frequency output unit 507a, notch frequency output unit 507b, and change forecaster 608 may each be achieved by an analog circuit or a digital circuit including dedicated hardware. The constituent elements may alternatively be achieved by execution of a program stored in a memory by a processor in a computer device including the memory and the processor.

The motor control device according to each of the first to fourth exemplary embodiments includes the feedback controller configured to feedback-control to cause the motor speed to follow the speed command. The motor control device may include, in addition to the feedback controller, a feedforward controller configured to calculate from the speed command, a torque command causing the motor speed to agree with the speed command.

The motor control device according to each of the first to fourth exemplary embodiments is configured to control the motor speed, but may alternatively be configured to control a position of the motor.

INDUSTRIAL APPLICABILITY

The present invention is widely applicable to mechanical equipment having a changeable mechanical resonant frequency.

REFERENCE MARKS IN THE DRAWINGS

100 motor
101 joint
102 mechanical load
200 speed detector
300 motor control device
301 feedback controller
302 notch filter
302a notch filter
302b notch filter
303 torque controller
304 notch controller
304a notch controller
304b notch controller
3041 vibration extracting filter
3042 detection notch filter
3043 notch frequency changer
305 change rate calculator
305a change rate calculator
305b change rate calculator
306 change rate monitor
400 motor control device
406 change rate monitor
500 motor control device
507 notch frequency output unit
507a notch frequency output unit
507b notch frequency output unit
508 change forecaster
600 motor control device
608 change forecaster
700 motor control device
701 feedback controller
702 notch filter
703 torque controller
710 notch frequency estimator

The invention claimed is:

1. A motor control device configured to feedback-control state quantity of a motor or a mechanical load, the device comprising:
   a first notch filter disposed inside a feedback control system and configured to change a frequency component to be removed;
   a first notch controller configured to change a first notch frequency as a center frequency of the first notch filter;
   a change rate calculator configured to successively calculate a notch frequency change rate indicating a change amount per unit time of the first notch frequency; and a change rate monitor configured to output a signal indicating that the notch frequency change rate has a value outside a first predetermined range when the notch frequency change rate has the value outside the first predetermined range.

2. The motor control device according to claim 1, wherein when the notch frequency change rate has a value outside a second predetermined range narrower than the first predetermined range, the change rate calculator calculates the notch frequency change rate at a shorter time interval for successive calculation of the notch frequency change rate in comparison to a case where the notch frequency change rate has a value within the second predetermined range.

3. The motor control device according to claim 1, wherein the first notch controller changes the first notch frequency only within a preset notch frequency range.

4. The motor control device according to claim 3, wherein the first notch frequency is set not to overlap with a control band of the feedback control system.

5. The motor control device according to claim 1, further comprising:
a second notch filter disposed inside the feedback control system and configured to change a frequency component to be removed; and
a second notch controller configured to change a second notch frequency as a center frequency of the second notch filter,
wherein
the first notch filter and the second notch filter are connected in series,
the change rate calculator calculates a notch frequency change rate for each of the first notch controller and the second notch controller, and
when at least one of the notch frequency change rates calculated by the change rate calculator has a value outside the first predetermined range, the change rate monitor outputs a signal indicating that the at least one of the notch frequency change rates has the value outside the first predetermined range.

6. A motor control method of feedback-controlling state quantity of a motor or a mechanical load, the method comprising:
a notch control step of changing a notch frequency as a center frequency of a notch filter configured to change a frequency component to be removed;
a change rate calculation step of successively calculating a notch frequency change rate indicating a change amount per unit time of the notch frequency; and
a change rate monitoring step of outputting a signal indicating that the notch frequency change rate has a value outside a predetermined range when the notch frequency change rate has the value outside the predetermined range.

* * * * *